(12) United States Patent
Huang et al.

(10) Patent No.: US 8,637,858 B2
(45) Date of Patent: Jan. 28, 2014

(54) TANDEM WHITE OLED

(75) Inventors: Qiang Huang, Dresden (DE); Ulrich Denker, Dresden (DE); Gufeng He, Shanghai (CN)

(73) Assignee: Novaled AG, Dresden (DE)

( * ) Notice: Subject to any disclaimer, the term of this patent is extended or adjusted under 35 U.S.C. 154(b) by 0 days.

(21) Appl. No.: 13/240,161

(22) Filed: Sep. 22, 2011

(65) Prior Publication Data

US 2012/0074392 A1 Mar. 29, 2012

(30) Foreign Application Priority Data

Sep. 24, 2010 (EP) ..................... 10400049

(51) Int. Cl.
*H01L 51/00* (2006.01)

(52) U.S. Cl.
USPC .. 257/40; 257/98; 257/E51.018; 257/E51.022

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 5,093,698 A | 3/1992 | Egusa | |
| 7,074,500 B2 | 7/2006 | Pfeiffer et al. | |
| 2005/0089717 A1 | 4/2005 | Cosimbescu et al. | |
| 2006/0188745 A1 | 8/2006 | Liao et al. | |
| 2006/0232194 A1* | 10/2006 | Tung et al. | 313/504 |
| 2007/0001587 A1 | 1/2007 | Hatwar et al. | |
| 2007/0001588 A1 | 1/2007 | Boroson et al. | |
| 2007/0046189 A1 | 3/2007 | Hatwar et al. | |
| 2008/0048557 A1 | 2/2008 | Birnstock et al. | |
| 2008/0203406 A1 | 8/2008 | He et al. | |
| 2008/0227979 A1 | 9/2008 | Saalbeck et al. | |
| 2008/0268282 A1 | 10/2008 | Spindler et al. | |
| 2008/0297036 A1 | 12/2008 | Noh et al. | |
| 2009/0045728 A1 | 2/2009 | Murano et al. | |
| 2009/0191428 A1 | 7/2009 | Hatwar et al. | |
| 2010/0044689 A1* | 2/2010 | Nishimura et al. | 257/40 |
| 2010/0288362 A1 | 11/2010 | Hatwar et al. | |
| 2011/0057559 A1 | 3/2011 | Xia et al. | |

FOREIGN PATENT DOCUMENTS

EP 1 804 309 A1 7/2007

OTHER PUBLICATIONS

Birnstock et al., "52.1: Highly Efficient White Top-Emission PIN OLEDs for Display and Lighting," SID Symposium Digest of Technical Papers, May 2010, vol. 41, pp. 774-777.
Liao et al., "54.2: Tandem White OLEDs Combining Fluorescent and Phosphorescent Emission," SID Symposium Digest of Technical Papers, May 2008, vol. 39, pp. 818-821.
Pieh et al., "60.3: Two-Stacked White Organic Light-Emitting Diodes Consisting of Fluorescent and Phosphorescent Hybrid Structure with High Efficiency and Good Color Characteristics," SID Symposium Digest of Technical Papers, Jun. 2009, vol. 40, pp. 903-906.

* cited by examiner

*Primary Examiner* — Julio J Maldonado
*Assistant Examiner* — Joseph Galvin, III
(74) *Attorney, Agent, or Firm* — Sutherland Asbill & Brennan LLP

(57) ABSTRACT

Organic electroluminescent devices and components containing the organic electroluminescent devices are provided herein. The organic electroluminescent devices include a substrate, a first light emitting unit, a second light emitting unit, a first electrode, and a second electrode. The light emitting units are positioned between the first and second electrode. The light emitting units have light emitting regions containing various emitter materials.

17 Claims, 4 Drawing Sheets

TANDEM WHITE OLED

CROSS-REFERENCE TO RELATED APPLICATIONS

This application claims priority to European Application No. 10400049.2, filed Sep. 24, 2010. The European application is incorporated herein by reference.

FIELD OF THE INVENTION

The invention relates to the technical field of organic light emitting diodes (OLED).

BACKGROUND

Since the demonstration of the first layer-structured OLED with reasonable efficiency by Tang, et al, in "Organic Electroluminescent Diodes" in U.S. Pat. No. 4,769,292, OLED has become increasingly interesting technology for lighting applications, among other applications. The prior art on tandem OLEDs relates mostly to a field other than lighting applications, namely the field of displays, where a broadband white emission is required, the emission being separated into basic colour components by colour filters.

Typical OLEDs and electrically doped OLEDs have been described in detail, for example, in EP 1336208; tandem OLEDs, including electrically doped tandem OLEDs have been described in detail, for example, in EP 1804309. U.S. 2009/0191428 A1 discloses tandem OLED having fluorescent emitters, having both units comprising fluorescent emitters. U.S. 2008/0297036 A1 discloses a tandem white OLEDs, wherein both units comprise the same blue fluorescent emitter. U.S. 2008/0268282A1 discloses a tandem white OLED wherein one light emitting unit has 2 emission peaks and the other unit is white. U.S. 2007/0046189 A1 discloses an intermediate connector for stacked OLEDs. U.S. 2007/0001587 A1 and U.S. 2007/0001588 A1 U.S. 2006/0188745 A1 disclose tandem white OLEDs having two broadband light emitting units.

Notwithstanding all the developments made in the OLED field, there are continuing needs for OLED devices that provide higher power efficiencies or good colour for illumination purposes, or both.

SUMMARY OF THE INVENTION

Organic electroluminescent devices are provided herein. In one aspect, the organic electroluminescent devices comprise a substrate, a first light emitting unit comprising a first light emitting region, and a second light emitting unit comprising a second light emitting region, wherein the light emitting units are arranged between a first electrode and a second electrode, wherein the first light emitting region comprises a green phosphorescent emitter and an additional phosphorescent emitter, wherein the additional phosphorescent emitter emits in the orange to red spectrum, and wherein the second light emitting region comprises either a blue and a green fluorescent emitter, or a green fluorescent emitter.

In another aspect, illumination devices comprising the organic electroluminescent devices are provided herein. The illumination devices include a Luminaire (light fixture), a free-standing luminaire, a fixed luminaire, or any other means for producing light, including, for example, a lamp. Non-limiting examples of free-standing light fixtures include desk-lamps, and decorative luminaire. Non-limiting examples of fixed luminaires include chandeliers, wall lamps, and under-cabinet light.

DETAILED DESCRIPTION

Figure 1:
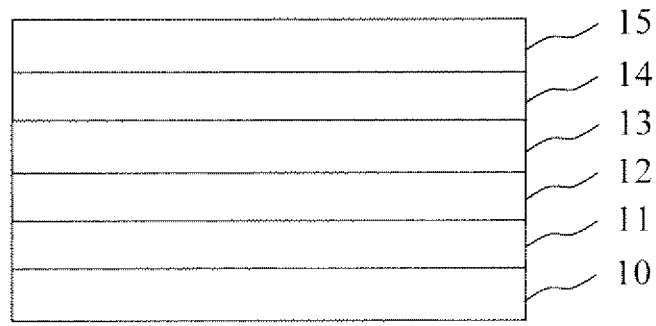
FIG. 1 is a schematic cross-sectional view of an embodiment of the present invention.

While the present invention may be embodied in many different forms, disclosed herein are specific illustrative embodiments thereof that exemplify the principles of the invention. It should be emphasized that the present invention is not limited to the specific embodiments illustrated.

In one particular embodiment, the first light emitting unit is arranged closer to the substrate than the second light emitting unit.

In another embodiment, the second electrode is a metal electrode wherein light generated by the OLED is emitted through the metal electrode. In certain embodiments, the metal electrode is transparent. In some embodiments, the transparent metal electrodes have a thickness of less than 25 nm. This embodiment can be combined with those described herein.

In another embodiment, the first electrode is closer to the substrate than the second electrode. In this embodiment, the second electrode may be a metal electrode wherein light generated by the OLED is emitted through the metal electrode.

In one embodiment, the first light emitting unit (LEUs) comprises only one light emitting region (LER), namely the first LER (LER1). In another embodiment, the second light emitting unit (LEUs) comprises only one light emitting region (LER), namely the second LER (LER2). Generally, a LER is a layer or layer stack comprising the layer(s) which generate light, i.e. the layers comprising the light emitting compounds.

In certain embodiments, the light emitted from LER1 originates entirely or nearly entirely from phosphorescent emitters. In some embodiments, at least greater than about 95 photon % of the light is emitted from phosphorescent emitters.

In particular embodiments, the light emitted from the LER2 originates entirely or nearly entirely from fluorescent emitters. In some embodiments, at least greater than about 95 photon % of the light is emitted from fluorescent emitters. In still further embodiments, the light from LER2 essentially originates from singlet excitons.

In one particular embodiment, the first light emitting region comprises an iridium compound. In another particular embodiment, the second light emitting region does not contain an iridium compound.

In one embodiment, the phosphorescent emitters are available in the form of emitter dopants, and the emitters from the LER1 are only of the phosphorescent kind.

In one embodiment, the blue and the green fluorescent emitters are spatially separated in the direction of the layer stack.

In one embodiment, the fluorescent emitters are available in the form of emitter dopants and the emitters from the LER2 are only of the fluorescent kind. In this embodiment, the blue and the green fluorescent emitters may be spatially separated in the direction of the layer stack.

In particular embodiments, the organic electroluminescent device disclosed herein comprises a light outcoupling layer. In one embodiment, the light outcoupling layer is arranged on at least one of the first and second electrodes, and on the side of the electrode which is not between the first and the second electrode. In one particular embodiment, the light outcoupling layer is arranged on top of the second electrode, wherein the second electrode is further away from the substrate than the first electrode. In these embodiments, the OLED may be a top-emitting OLED.

In particular embodiments, the outcoupling layer comprises an organic material. In some embodiments, the organic material is an organic conjugated material. In further embodiments, the outcoupling layer has a thickness of greater than about 500 nm. In still further embodiments, the outcoupling layer is a scattering layer.

Generally, the OLEDs provided herein may be tandem OLEDs, which means that there is no additional electrode between the first and second electrodes. These particular devices comprise only 2 LEUs, but can comprise additional auxiliary layers which may not be light emitting.

In certain embodiments, the colour of the OLEDs' emitted light is warm white. In certain embodiments, the OLEDs satisfy the U.S. Department of Energy (DoE) quadrangles at Illuminant A. In other certain embodiments, the OLEDs satisfy the more restrictive 7step MacAdams Ellispis around Illuminant A.

In certain embodiments, it was found out that by adding a fluorescent green EML to an LEU2 comprising a fluorescent blue EML, the green emission spectrum was improved—thus achieving higher CRI (colour Rendering Index)—and, unexpectedly, the tandem OLED achieved around 10% higher power efficiency.

In some embodiments, the second ELU is purely fluorescent, which may provide a longer lifetime for the device.

FIG. 1 shows a cross-sectional of a tandem OLED comprising a substrate (10), a first electrode (11), a second electrode (15), and the organic layers (12,13,14) between the first (11) and the second electrodes (15). The LEU1 (12) and LEU2 (14) are separated by a connecting unit (13), however the connecting unit (13) can be integral part of neighbouring layers of LEU1 (12) and LEU2 (14). The position of LEU1 and LEU2 can be exchanged. LEU1 comprises a green phosphorescent emitter and an additional phosphorescent emitter, the additional phosphorescent emitter emitting in the red to orange region. LEU2 comprises a green fluorescent emitter. Alternatively, LEU2 comprises a green fluorescent emitter and a blue fluorescent emitter.

Figure 2:
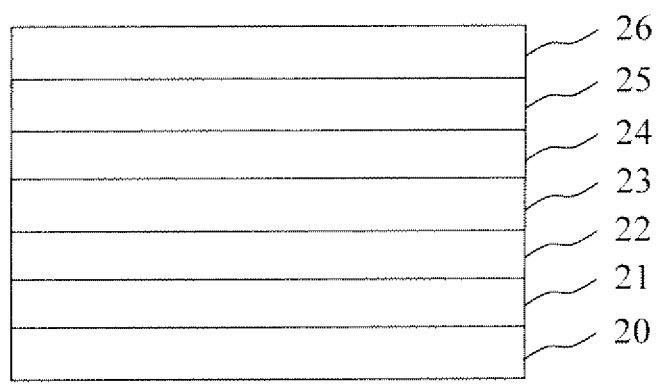
FIG. 2 is a schematic cross-sectional view of a particular embodiment of the present invention.

FIG. 2 shows a cross-sectional of a tandem OLED comprising a substrate (20), a first electrode (21), a second electrode (25), and the organic layers (22,23,24) between the first (21) and the second electrodes (25). The LEU1 (22) and LEU2 (24) are separated by a connecting unit (23), however the connecting unit (23) can be an integral part of neighbouring layers of LEU1 (22) and LEU2 (24). The position of LEU1 and LEU2 can be exchanged. LEU1 comprises a green phosphorescent emitter and an additional phosphorescent emitter, the additional phosphorescent emitter emitting in the red to orange region. LEU2 comprises a green fluorescent emitter. Alternatively, LEU2 comprises a green and a blue fluorescent emitter. The OLED of FIG. 2 is a top emitting OLED if the second electrode (25) is transparent and the first electrode (21) and/or the substrate (20) is not-transparent, or it is a transparent OLED, if both electrodes (21,25) and the substrate (20) are transparent. An outcoupling layer (25) is provided on top of the second electrode (25).

Figure 3:
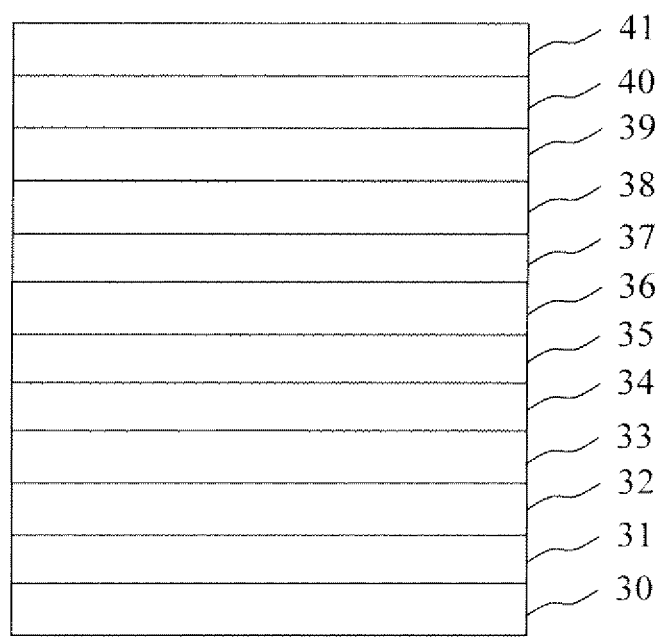
FIG. 3 is a schematic cross-sectional view of a particular embodiment of the present invention with an outcoupling layer.

FIG. 3 shows a cross-sectional of a tandem OLED comprising a substrate (30), a first electrode (31), a second electrode (40), and the organic layers (32-38) between the first (31) and the second electrodes (40), further comprising an outcoupling layer (41) over the second electrode (40). The second electrode (40) is further apart from the substrate than the first electrode (31). In this embodiment, the LEU1 comprises HTL1 (32), a green emitting layer (33), a red to orange emitting layer (34), and an ETL1 (35). The green and red to orange light emitting layers (33,34) form LER1, in this stack, and comprise phosphorescent emitters for emitting light in the respective colours. In this embodiment, the LEU2 comprises HTL2 (36), a blue emitting layer (37), a green emitting layer (38), and an ETL2 (39). The green and blue light emitting layers (33,38) form LER2, in this stack, and comprise fluorescent emitters for emitting light in the respective colours.

In certain embodiments of the device shown in FIG. 3, the HTL1 and HTL2 comprises a p-dopant. In one embodiment, HTL1 is subdivided into a p-doped and an undoped sublayer, wherein the undoped sublayer is closer to LER1 than the p-doped sublayer. In this embodiment, HTL2, alternatively or in addition, is subdivided into a p-doped and an undoped sublayer, wherein the undoped sublayer is closer to LER2 than the p-doped sublayer. These embodiments may also include an interlayer between HTL2 and ETL1, wherein the interlayer has a thickness of less than about 10 nm.

In certain embodiments of the device shown in FIG. 3, the ETL1 and ETL2 comprise an n-dopant. In one embodiment, ETL1 is subdivided into an n-doped and an undoped sublayer, wherein the undoped sublayer is closer to LER1 than the n-doped sublayer. In this embodiment, ETL2, alternatively or in addition, is subdivided into an n-doped and an undoped sublayer, wherein the undoped sublayer is closer to LER2 than the n-doped sublayer. These embodiments may also include an interlayer between HTL2 and ETL1, wherein the interlayer has a thickness of less than about 10 nm.

In certain embodiments, the neighbouring sections of ETL1 and of HTL2 form the connecting unit. In one embodiment, the connecting unit is formed by the n-doped ETL1 neighbouring and in direct contact to the p-doped HTL2 (by n:ETL1/p:HTL2 or its respective doped sublayers). In another embodiment, one of ETL1 and HTL2 is not doped and the connecting unit is formed by inserting an interlayer between ETL1 and HTL2, forming one of the following connections:

n:ETL1/interlayer (preferentially a p-dopant form HTL2)/ HTL2;

n:ETL1/interlayer (preferentially a n-dopant for ETL1)/ HTL2.

The device of FIG. 3 further comprises an outcoupling layer (41) on the side of the second electrode (40) which does not face the substrate (30). In certain embodiments, the outcoupling layer (41) is a scattering layer.

In the device of FIG. 3, the first electrode (31) may be reflective and the second electrode (41) may be a transparent electrode.

Device Architecture

Substrate

Generally, the substrate can be flexible or rigid, transparent, opaque, reflective, or translucent. In certain embodiments, the substrate should be transparent or translucent if the light generated by the OLED is to be transmitted through the substrate (bottom emitting). In other embodiments, the substrate may be opaque if the light generated by the OLED is to be emitted in the direction opposite of the substrate, the so called top-emitting type. In still other embodiments, the OLED can also be fully transparent.

Electrodes

Generally, one of the first and the second electrodes is the anode, and the other is the cathode. Typically, the electrodes provide a certain amount of conductivity. In certain embodiments, the electrodes are conductors. At least one of the electrodes must be transparent to enable the light transmission to the outside of the device.

Transparent is defined herein as enabling at least an essential portion of the generated light (greater than about 10% of the photons) to be transmitted through the electrode. Therefore, in certain embodiments, transparency is only required in the region in which the device emits light, unless it is desired that external light (such as ambient light) is also transmitted (for mirror like or totally transparent devices).

Typical electrodes are layers or a stack of layers, comprising metal and/or transparent conductive oxide. Other possible electrodes are made of thin busbars (e.g. a thin metal grid) wherein the spaces between the busbars is filled (coated) with a transparent material with a certain conductivity, such as graphene, carbon nanotubes, doped organic semiconductors, etc. In one embodiment, the anode is the electrode closest to the substrate, and this configuration is called a non-inverted structure. In another embodiment, the cathode is the electrode closest to the substrate, and this configuration is called an inverted structure.

Hole-Injecting Layer (HIL)

Generally, a HIL is a layer which facilitates the injection of holes from the anode or from the hole generating side of a connecting unit into an adjacent HTL. Typically, the HIL is a very thin layer (<about 10 nm). In certain embodiments, the hole injection layer can be a pure layer of p-dopant and can be about 1 nm thick. In some embodiments, the HTL is doped, and an HIL may not be necessary, since the injection function is already provided by the HTL.

Hole-Transporting Layer (HTL)

Generally, a HTL is a layer comprising a large gap semiconductor that transports holes from the anode or holes from a CGL to the light emitting layer. Typically, the HTL is arranged between the anode and the light emitting layer or between the hole generating side of a CGL and the light emitting layer. In some embodiments, an HTM can be mixed with another material, for example a p-dopant, in which case it is said the HTL is p-doped. In certain embodiments, the HTL can comprise several layers, which can have different compositions. In some embodiments, p-doping the HTL lowers its resistivity and avoids the respective power loss due to the otherwise high resistivity of the undoped semiconductor. In other embodiments, a doped HTL can also be used as optical spacer, because it can be made very thick, up to 1000 nm or more without a significant increase in resistivity.

Light Emitting Unit (LEU)

Generally, a LEU is the stack of layers comprising the semiconducting layers responsible for transport of charge carriers and the layers responsible for light emission. In one embodiment, a LEU is a single light emitting unit, and if 100% quantum efficiency is assumed, it would emit one photon per electron injected in the LEU (in contrast to stacked light emitting units, where more than one photon can be emitted per injected electron at the expense of a higher operating voltage). In certain embodiments, each LEU has only one light emitting region.

In certain embodiments, the first LEU (LEU1) comprises phosphorescent emitters and the second LEU (LEU2) comprises fluorescent emitters. In further embodiments, LEU1 is closer to the reflective substrate.

Light Emitting Region (LER)

In some embodiments, the light emitting regions (LER) comprise at least one light emitting layer. In certain embodiments, the light emitting regions comprise interlayers between at least two light emitting layers of the same LEU.

Light-Emitting Layer

Generally, the light emitting layer comprises at least one emission material. In some embodiments, the LEL comprises a mixture of two or more materials, and, in these embodiments, the charge carrier injection may occur in different materials. For instance, in a material which is not the emitter, or the charge carrier injection can also occur directly into the emitter. Typically, many different energy transfer processes can occur inside the LEL or adjacent LELs leading to different types of emission. For instance, in some embodiments, excitons can be formed in a host material and then be transferred as singlet or triplet excitons to an emitter material which can be singlet or triplet emitter which then emits light. In further embodiments, a mixture of different types of emitter can by provided for higher efficiency. In still further embodiments, mixed light can be realized by using emission from an emitter host and an emitter dopant.

In some embodiments, blocking layers can be used to improve the confinement of charge carriers in the LEL. In certain embodiments, these blocking layers are external to the LELs. Examples of blocking layers are further explained in U.S. Pat. No. 7,074,500 B2.

Figure 4:
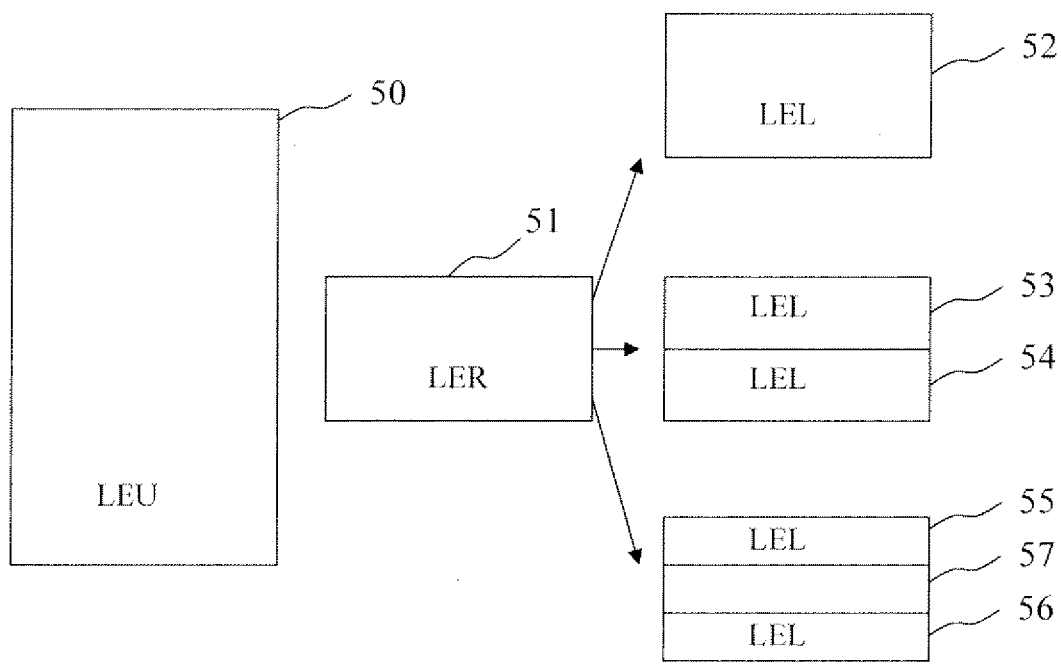
FIG. 4 is a schematic cross-sectional view of particular embodiments of a light emitting region.
Figure 5:
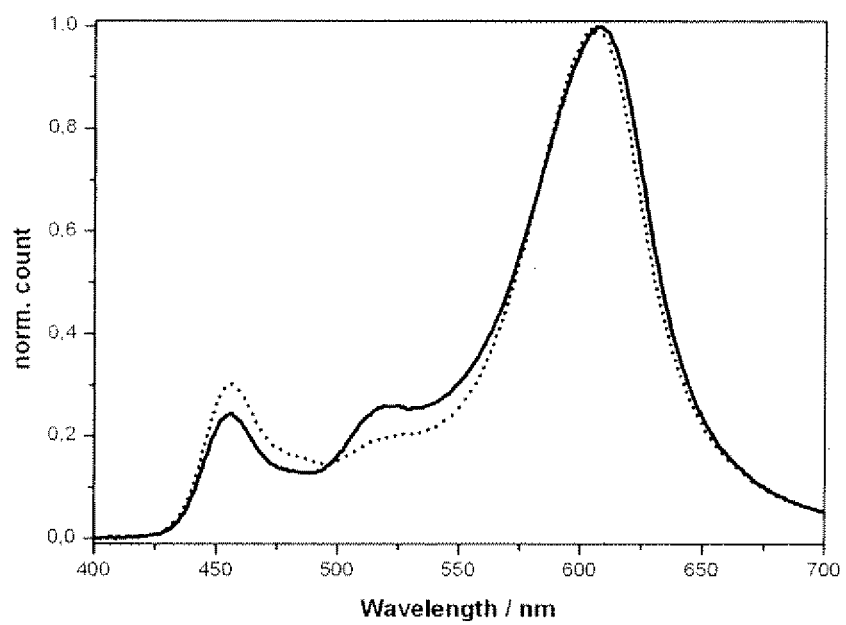
FIG. 5 shows the emission spectra of 2 OLED, one with blue fluorescent emitting unit and another with a blue and green fluorescent emitting unit.

FIG. 4 shows a schematic cross-sectional view of one embodiment of a light emitting region. In this embodiment, a LEU (50) contains one LER (51), there are 3 particular embodiments for the LER (51):

(1) In a first embodiment for the LER (51), it is a single light emitting layer (52), wherein the light emitting layer (52) comprises a matrix material or matrix material mixture through the whole layer, and this layer further comprises the emitter dopants. In this first embodiment, the LER may contain only the matrix (matrix material or matrix material mixture) and the emitter dopants. Further, the emitter dopants may be mixed as a gradient in the direction of the layer thickness of the LER (51). Still further, the emitter dopants may be homogeneously mixed in the LER (51). Furthermore, the emitter dopants may be spatially separated in the direction of the layer thickness of LER (51).

(2) In a second embodiment for the LER (51), it contains a first light emitting layer (53) and a second light emitting layer (54). In this embodiment, the first light emitting layer (53) contains a first matrix material or matrix material mixture through the whole layer, and an emitter dopant; the second light emitting layer (54) contains a second matrix material or matrix material mixture through the whole layer, and a second emitter dopant. In this embodiment, the first matrix material or matrix material mixture and the second matrix material or matrix material mixture may be different from each other, and may form a staggered type II heterojunction, especially when the emitter dopants are of the phosphorescent type.

(3) In a third embodiment for the LER (51), it contains a first light emitting layer (55), a second light emitting layer (56), and an interlayer (57). In this embodiment, the first light emitting layer (55) contains a first matrix material or matrix material mixture through the whole layer, and an emitter dopant; the second light emitting layer (55) contains a second matrix material or matrix material mixture through the whole layer, and a second emitter dopant. In this embodiment, the first matrix material or matrix material mixture and the second matrix material or matrix material mixture may be different from each other, and may form a staggered type II heterojunction, especially when the emitter dopants are of the phosphorescent type. In certain embodiments, the interlayer is preferred when the emitter dopants are of the phosphorescent type.

As is typically the case with such figures, the above are simplified schematic representation presented for purposes of illustration only, and the actual structures will differ in numerous respects including the relative scale of the components.

Electron-Transporting Layer (ETL)

Generally, the ETL may be a layer comprising a large gap semiconductor capable of transporting electrons (ETM) from the cathode or electrons from a CGL to the light emitting layer. Typically, the ETL is arranged between the cathode and the light emitting layer or between the electron generating side of a CGL and the tight emitting layer. In certain embodiments, a ETM can be mixed with another material, for example an n-dopant, in which case it is said the ETL is n-doped. In some embodiments, the ETL can comprise several layers, which can have different compositions. In further embodiments, n-doping the ETL lowers its resistivity and avoids the respective power loss due to the otherwise high resistivity of the undoped semiconductor. In particular embodiments, the doped ETL can also be used as an optical spacer, because it can be made very thick, up to 1000 nm or more without a significant increase in resistivity.

Electron-Injecting Layer (EIL)

Generally, a number of different techniques for providing EILs can be used. Some of those techniques are explained below: the OLED, in some embodiments, can comprise a buffer layer between the cathode and its closest ETL. In embodiments, this buffer layer can provide protection against the cathode deposition or metal diffusion from the cathode. Generally, this buffer layer is referred to as a buffer or as an injection layer. Another kind of injection layer, used in other embodiments, is a layer comprising an n-dopant between the ETL and the cathode. This layer, in one embodiment, can be a pure layer of n-dopant which is typically less than about 5 nm thick. In one embodiment, it is about 1 nm thick. Typically, the use of the strong donor (n-dopant) as injection layer provides lower voltages and higher efficiency in the device. In certain embodiments, if the ETL is n-doped, then the infection layer may not be necessary. Non-limiting types of other injection layers include metal doped organic layer, typically using alkali metals, thin layer of a metal complexes (such as Lithium quinolate), inorganic salts (such as LiF, NaCl, etc), thin low work function metal layers.

Connecting Unit, Also Named Charge Generation Layer (CGL)

In embodiments, the OLED comprises a CGL which can be used in conjunction with an electrode as inversion contact. Alternatively or in addition, in other embodiments, the CGL can be used as a connecting unit that connects LEU1 to LEU2. Generally, a CGL can have a number of different configurations and names, including, but not limited to, pn-junction, connecting unit, tunnel junction, etc. Examples of pn junctions are disclosed in U.S. 2009/0045728 A 1, U.S. 2010/0288362 A1. In some embodiments, metal layers and/or insulating layers can also be used. In certain embodiments, connecting units between LEU1 and LEU2 are formed by directly connecting LEU1 to LEU2, the adjacent layers from each LEU being configured to form a CGL.

Deposition of Organic Layers

Any organic semiconducting layers of the inventive display, can be deposited by known techniques, such as vacuum thermal evaporation (VTE), organic vapour phase deposition, laser induced thermal transfer, spin coating, blade coating, slot dye coating, inkjet printing, etc. A preferred method for preparing the OLED according to the invention is vacuum thermal evaporation.

Encapsulation

In some embodiments, the OLED is encapsulated. In certain embodiments, the encapsulation is necessary to improve the lifetime, and avoid, among others, oxygen and water induced degradation.

Outcoupling Layer

Generally, the outcoupling layer may influence the diffusion of the optical modes within the organic layers and the transparent electrode in such a manner that the optical modes are easier decoupled and more light is emitted out of the device. Examples of outcoupling layers are explained in U.S. 2008048557 A1.

In some embodiments, the OLED is a top emitting OLED with a scattering outcoupling layer on the top electrode. In certain embodiments, the scattering layer is formed from organic materials; typically, such layers can easily be deposited, e.g., by vacuum thermal evaporation on the electrode. In particular embodiments, a nominal layer thickness of >about 500 nm is used.

Generally, the outcoupling layer may comprise any suitable material. In some embodiments, the outcoupling layer comprises one of the following: 1,4-bis(benzo[d]oxazol-2-yl)benzene; 4,4'-bis(benzo[d]oxazol-2-yl)-1,1'-biphenyl; 1,4-bis(benzo[d]oxazol-2-yl)naphthalene; 5,12-Dioxa-7,14-dithia-pentacen; 5,9,16-trioxa-7,14,18-trithiaheptacen; 3,10-Dimethoxy-5,12-dioxa-7,14-dithiapentacene; or a combination thereof.

Generally, a scattering layer may be defined as a layer which scatters the light in a diffuse way such that the angle of the light is randomly changed.

Electrical Doping

In some embodiments, the OLEDs comprise doped layers. Typically, doping one or more layers of an OLED may increase the reliability and efficiency of the device. Generally, by electrically doping hole transport layers with a suitable acceptor material (p-doping) or electron transport layers with a donor material (n-doping), respectively, the density of charge carriers in organic solids (and therefore the conductivity) can be increased, sometimes substantially. Additionally, analogous to the experience with inorganic semiconductors, some applications can be envisioned which are precisely based on the use of p- and n-doped layers in a component and otherwise would be not conceivable. Examples of the use of doped charge-carrier transport layers (p-doping of the hole transport layer by admixture of acceptor-like molecules, n-doping of the electron transport layer by admixture of donor-like molecules) in organic light-emitting diodes is, e.g., described in U.S. 2008/203406 and U.S. Pat. No. 5,093,698.

Generally, the devices provided herein can be used in addition to or in combination with electrical doping of organic semiconducting layers. Typically, this electrical doping is also commonly referred to as redox-doping or charge transfer doping. It is known that the doping may increase the density of charge carriers of a semiconducting matrix towards the charge carrier density of the undoped matrix.

U.S. 2008/227979 discloses the doping of organic transport materials, with inorganic and with organic dopants. Basically, an effective electronic transfer occurs from the dopant to the matrix increasing the Fermi level of the matrix. For an efficient transfer in a p-doping case, in some embodiments, the LUMO energy level of the dopant should be more negative than the HOMO energy level of the matrix or at least slightly more positive, not more than 0.5 eV, to the HOMO energy level of the matrix. For the n-doping case, the HOMO energy level of the dopant, in certain embodiments, should be more positive than the LUMO energy level of the matrix or at least slightly more negative, not lower than 0.5 eV, to the LUMO energy level of the matrix. In certain embodiments, the energy level difference for energy transfer from dopant to matrix is smaller than about +0.3 eV.

Non-limiting examples of doped hole transport materials include the following: copperphthalocyanine (CuPc), which HOMO level is approximately −5.2 eV, doped with tetrafluoro-tetracyanoquinonedimethane (F4TCNQ), which LUMO level is about −5.2 eV; zincphthalocyanine (ZnPc) (HOMO=−5.2 eV) doped with F4TCNQ; a-NPD (N,N'-Bis (naphthalen-1-yl)-N,N'-bis(phenyl)-benzidine) doped with F4TCNQ; a-NPD doped with 4,4',4''-(1E,1'E,1''E)-Cyclopropan-1,2,3-triylidentris(cyanomethan-1-yl-1-yliden)tris (2,3,5,6-tetrafluorbenzonitril) (PD1).

Non-limiting examples of doped electron transport materials include: fullerene C60 doped with acridine orange base (AOB); perylene-3,4,9,10-tetracarboxylic-3,4,9,10-dianhydride (PTCDA) doped with leuco crystal violet; 2,9-di (phenanthren-9-yl)-4,7-diphenyl-1,10-phenanthroline doped with tetrakis(1,3,4,6,7,8-hexahydro-2H-pyrimido[1,2-a]pyrimidinato)ditung-sten (II) (W(hpp)4); naphthalene tetracarboxylic acid di-anhydride (NTCDA) doped with 3,6-bis-(dimethyl amino)-acridine; NTCDA doped with bis (ethylene-dithio)tetrathiafulvalene (BERT-TTF); 4-(naphthalen-1-yl)-2,7,9-triphenylpyrido[3,2-h]quinazoline (ETL1) doped with W(hpp)4.

Materials

Generally, any materials with an appropriate emission range may be used in the devices described herein. In certain embodiments, the emission ranges are—

Blue emission having a peak between 440 nm and 500 nm.
Orange emission having a peak between 560 nm and 620 nm.
Green emission having a peak between 500 and 560 nm.
Red emission having a peak between 620 and 700 nm.

Generally, any of the known emitters dopants may be used in the devices described herein.

Emitters

Non-limiting examples of fluorescent red emitter dopants include diindenoperylene compounds such as 5,10,15,20-tetraphenylbenzo[ghi]benzo[5,6]indeno[1,2,3-cd]benzo[5,6]indeno[1,2,3-lm]perylene; 5,10,15,20-tetraphenyl-7,8-dihydrobenzo[5,6]indeno[1,2,3-cd]benzo[5,6] indeno[1,2,3-lm]perylene; 1,2,3,4,9,10,11,12-octaphenyl-6,7-dihydrodiindeno[1,2,3-cd:1',2',3'-lm]perylene.

Non-limiting examples of fluorescent orange or yellow emitters include 5,6,11,12-tetraphenyltetracene; 5,6,11,12-tetra(naphthalen-2-yl)tetracene; 2,8-di-tert-butyl-5,6,11,12-tetrakis(4-(tert-butyl)phenyl)tetracene.

In certain embodiments, green fluorescent emitter dopants can be selected, for example, from quinacridones, coumarin, and others; non-limiting examples of green fluorescent emitter dopants include quinolino[2,3-b]acridine-7,14(5H,12H)-dione; 3,10-difluoroquinolino[2,3-b]acridine-7,14(5H,12H)-dione; 5,12-diphenylquinolino[2,3-b]acridine-7,14(5H,12H)-dione; 3-(benzo[d]oxazol-2-yl)-7-(diethylamino)-2H-chromen-2-one; 7-(diethylamino)-3-(4,6-dimethylbenzo[d]thiazol-2-yl)-2H-chromen-2-one; 10-(benzo[d]thiazol-2-yl)-1,1,7,7-tetramethyl-2,3,6,7-tetrahydro-1H-pyrano[2,3-f]pyrido[3,2,1-ij]quinolin-11(5H)-one; 10-(4,6-di-tert-butylbenzo[d]thiazol-2-yl)-1,1,7,7-tetramethyl-2,3,6,7-tetrahydro-1H-pyrano[2,3-f]pyrido[3,2,1-ij]quinolin-11 (5H)-one; GD403 from Kodak, Rochester, N.Y., USA (GFD1).

Non-limiting examples of fluorescent blue emitter dopants are 9-(naphthalen-1-yl)-10-(naphthalen-2-yl)anthracene; (Z)-6-mesityl-N-(6-mesitylquinolin-2(1H)-ylidene)quinolin-2-amine-BF2 complex; bis[2-[4-[N,N-diarylamino]phenyl]vinyl]biphenyl; 2,5,8,11-tetra-tert-butyl-1,10-dihydroperylene; SFC_NUBD369 from Sun Fine Chemicals (Korea) (BFD1); SFC_NUBD005 from Sun Fine Chemicals (Korea) (BFD2);

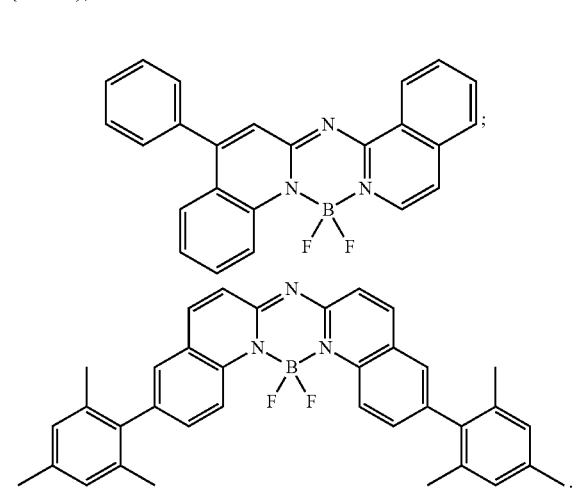

Examples of suitable red phosphorescent emitter dopants are disclosed in U.S. 2011/057559 on pages 33-35, table 1, titled "red dopants", which is incorporated herein by reference. In some embodiments, a suitable material is the orange emitter Iridium(III)bis(2-methyldibenzo-[f,h]quinoxaline) (acetylacetonate) from American Dye Source, Quebec, Canada (OTD1), or the orange emitter CGX-EL150 from Ciba (now BASF, New Jersey, USA). Examples of suitable green phosphorescent emitter dopants are disclosed in U.S. 2011/057559 on pages 35-38, table 1, titled "green dopants", which is incorporated herein by reference. In some embodiments, a suitable material is Ir(ppy)3.

Examples of suitable host materials for fluorescent emitters are, among others, anthracene derivatives substituted at the 9 and 10 positions, for example 9,10-di-(2-naphthyl)anthracene, compounds, which are disclosed in U.S. 2005/089717 A1, compounds AH1, AH2, AH3, AH4, AH5, AH6, AH7, AH8 as disclosed in pages 11-12 in U.S. 2008/0268282 A 1, SFC_ABH113 (from Sun Fine Chemicals, Korea) (FH1); BH3 from Kodak, Rochester, N.Y., USA (FH2).

Examples of suitable host materials for red phosphorescent dopants are disclosed in U.S. 2011/057559 on pages 28-29, table 1, titled "red host", which is incorporated herein by reference. In some embodiments, suitable host materials for green phosphorescent dopants are disclosed in U.S. 2011/057559 on pages 29-32, table 1, titled "green host", which is incorporated herein by reference. In other embodiments, particular suitable host materials for blue phosphorescent dopants are disclosed in U.S. 2011/057559 on pages 32-33, table 1, titled "blue host", which is incorporated herein by reference.

In some embodiments, suitable host materials for phosphorescent emitters are TCTA (publicly accessible commercial material); TMM004 (from Merck, N.J., USA).

Many of the emitter dopants and hosts described above are commercially available, for example, from Luminescence Technology Corp, TW (Palo Alto, Calif., USA). Other commercially available phosphorescent or fluorescent emitter host and dopant systems may be used to one-to-one replace the respective kind of emitters used in aforementioned embodiments. In the same way, the material used in the light extraction layer may be replaced with other commercially accessible materials having lighting scattering property. Other commercially accessible organic dopant materials and transport materials may also be used in the embodiments of the invention.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

Example 1

An OLED was fabricated, on a glass substrate coated with ITO, with the following layer structure:
Anode of Ag with a layer thickness of 100 nm;
hole transport layer of a-NPD (N,N'-Bis(naphthalen-1-yl)-N,N'-bis(phenyl)-benzidine) with a layer thickness of 55 nm, this layer was p-doped by co-evaporation with PD1 (3%);
10 nm of undoped of a-NPD (N,N'-Bis(naphthalen-1-yl)-N,N'-bis(phenyl)-benzidine), as part of the hole transport layer, this layer also has the function of an electron blocking layer;
TCTA doped with Ir(ppy)3 (8%) as red emitting layer with a thickness of 5 nm;
TMM004 doped with Ir(ppy)3 and CGX-EL150 with a ratio 79.5:20:0.5 forming a green/orange emitting layer with a thickness of 25 nm;
ET1 doped with W(hpp)4 (8%) forming a first electron transporting layer with a thickness of 70 nm;
An a-NPD layer doped with PD1 with a thickness of 10 nm as part of the second HTL;
Blue fluorescent emitting layer consisting of FH1 doped with BFD2 (10%) with a thickness of 25 nm;
5 nm of ET1 as undoped ETL;
100 nm of ET1 doped with W(hpp)4 (8%) as n-doped ETL;
Transparent cathode consisting of 15 nm of Ag;

With this device, an OLED with a good colour rendering index was not achieved, almost only orange emission was observed.

Example 2

An OLED was fabricated according to example 1, wherein the blue fluorescent emitting layer consisting of FH1 doped with BFD2 (10%) was made with a thickness of 15 nm immediately followed by a green fluorescent emitting layer consisting of FH2 doped with GFD1 (5%) with a thickness of 10 nm (between the blue emitting layer and the undoped ETL). With this device it was possible to improve the power efficiency and the colour rendering, however the emitted light had a strong colour dependency with the angle of observation.

Example 3

An OLED was fabricated, on a glass substrate coated with ITO, with the following layer structure:
Anode of Ag with a layer thickness of 100 nm;
hole transport layer of a-NPD (N,N'-Bis(naphthalen-1-yl)-N,N'-bis(phenyl)-benzidine) with a layer thickness of 55 nm, this layer was p-doped by co-evaporation with PD1 (3%);
10 nm of undoped of a-NPD (N,N'-Bis(naphthalen-1-yl)-N,N'-bis(phenyl)-benzidine), as part of the hole transport layer, this layer also has the function of an electron blocking layer;
TCTA doped with Ir(ppy)3 (8%) as red emitting layer with a thickness of 5 nm;
TMM004 doped with Ir(ppy)3 and CGX-EL150 with a ratio 79.5:20:0.5 forming a green/orange emitting layer with a thickness of 25 nm;
ET1 doped with W(hpp)4 (8%) forming a first electron transporting layer with a thickness of 70 nm;
An a-NPD layer doped with PD1 (3%) with a thickness of 10 nm as part of the second HTL;
Blue fluorescent emitting layer FH1 doped with BFD2 (10%) was made with a thickness of 15 nm;
green fluorescent emitting layer consisting of FH2 doped with GFD1 (5%) with a thickness of 10 nm
5 nm of ET1 as undoped ETL;
100 nm of ET1 doped with W(hpp)4 (8%) as n-doped ETL;
Transparent cathode consisting of 15 nm of Ag;
Outcoupling layer with a thickness of 800 nm;

With this device it was possible to obtain a power efficiency of 36 lm/W at 1000 nits in an integrating sphere, and colour coordinates of x=0.45 and y=0.40 which is inside the DoE specification for warm white and very close to illuminant A. The angle dependency was extremely small.

The angular variation of the color coordinate with the angle to the normal is given in the table below.

| Angle | CIE-X | CIE-Y |
|-------|-------|-------|
| 0     | 0.46  | 0.38  |
| 30    | 0.46  | 0.39  |
| 70    | 0.43  | 0.41  |

The features of the invention as disclosed in the above description and in the figures, either taken alone or in any combination, can be used to make various embodiments comprised in the invention.

We claim:
1. An organic electroluminescent device comprising:
a substrate,
a first light emitting unit,
a second light emitting unit,
a first electrode, and
a second electrode;

wherein the first light emitting unit and the second light emitting are arranged between the first electrode and the second electrode;

wherein the first light emitting unit comprises a first light emitting region comprising a green phosphorescent emitter and an additional phosphorescent emitter, wherein the additional phosphorescent emitter emits in the orange to red spectrum; and wherein the second light emitting unit comprises a second light emitting region consisting of a green fluorescent emitter.

2. The organic electroluminescent device of claim 1, wherein the first light emitting unit is arranged closer to the substrate than the second light emitting unit.

3. The organic electroluminescent device of claim 1, wherein the first electrode is arranged closer to the substrate than the second electrode.

4. The organic electroluminescent device of claim 1, wherein the second electrode comprises a metal electrode, wherein light generated by the device passes through at least a portion of the metal electrode.

5. The organic electroluminescent device of claim 1, wherein the first light emitting region is the only light emitting region associated with the first light emitting unit.

6. The organic electroluminescent device of claim 1, wherein the second light emitting region is the only light emitting region associated with the second light emitting unit.

7. The organic electroluminescent device of claim 1, wherein the first light emitting region comprises an iridium compound.

8. The organic electroluminescent device of claim 1, wherein the second light emitting region lacks an iridium compound.

9. The organic electroluminescent device of claim 1, wherein the light emitted from the second light emitting region originates from singlet excitons.

10. The organic electroluminescent device of claim 1, wherein the phosphorescent emitters comprise emitter dopants, and the first light emitting region contains only phosphorescent emitters.

11. The organic electroluminescent device of claim 1, wherein the fluorescent emitters comprise emitter dopants.

12. The organic electroluminescent device of claim 1, wherein the device comprises a light outcoupling layer, wherein the light outcoupling layer is arranged on at least one of the first electrode and second electrode, and wherein the light outcoupling layer is not arranged between the first electrode and second electrode.

13. The organic electroluminescent device of claim 12, wherein the light outcoupling layer is arranged on the side of the second electrode that is opposite the first electrode.

14. The organic electroluminescent device of claim 12, wherein the light outcoupling layer is a scattering layer.

15. The organic electroluminescent device of claim 12, wherein the light outcoupling layer comprises an organic material.

16. The organic electroluminescent device of claim 15, wherein the organic material comprises an organic conjugated material.

17. The organic electroluminescent device of claim 16, wherein the organic conjugated material has a thickness of greater than about 500 nm.

* * * * *